United States Patent
Nakagawa

(10) Patent No.: US 6,713,963 B2
(45) Date of Patent: Mar. 30, 2004

(54) ULTRA-HIGH PRESSURE DISCHARGE LAMP

(75) Inventor: Atsuji Nakagawa, Himeji (JP)

(73) Assignee: Phoenix Electric Co., Ltd., Hyogo (JP)

( * ) Notice: Subject to any disclaimer, the term of this patent is extended or adjusted under 35 U.S.C. 154(b) by 0 days.

(21) Appl. No.: 10/353,860

(22) Filed: Jan. 29, 2003

(65) Prior Publication Data

US 2003/0146705 A1 Aug. 7, 2003

(51) Int. Cl.⁷ ................................. H01J 61/30
(52) U.S. Cl. .................. 313/623; 313/624; 313/625; 313/634
(58) Field of Search ................ 313/623, 624, 313/625, 634

(56) References Cited

U.S. PATENT DOCUMENTS 3,900,754 A * 8/1975 Mason et al. ............... 313/635
5,374,872 A 12/1994 Balaschak et al.
5,424,609 A * 6/1995 Geven et al. ............... 313/623

* cited by examiner

Primary Examiner—David Vu
(74) Attorney, Agent, or Firm—Jordan and Hamburg LLP

(57) ABSTRACT

An ultra-high pressure discharge lamp is provided having seal portions of a structure capable of realizing a pressure resistance of 100 atm or higher while ensuring a higher yield. The ultra-high pressure discharge lamp includes: a pair of mounts each comprising a metal foil having one end welded to an associated electrode and an opposite end welded to an associated external lead pin, and a preseal glass member embedding the metal foil therein; and a quartz envelope having an arc tube portion provided with a pair of seal portions on opposite sides thereof, the electrodes associated with the respective mounts being disposed opposite to each other in the arc tube portion, the preseal glass member being hermetically sealed in a respective one of the seal portions, wherein the preseal glass member has a portion fused to an inner peripheral surface of the respective seal portion over an entire circumference thereof.

5 Claims, 3 Drawing Sheets

ULTRA-HIGH PRESSURE DISCHARGE LAMP

BACKGROUND OF THE INVENTION

1. Field of the Invention

The present invention relates to an ultra-high pressure discharge lamp having remarkably improved pressure resistance.

2. Description of the Related Art

Recently, ultra-high pressure discharge lamps have been frequently used not only as light sources in liquid crystal projectors for projecting images but also as optical fiber light sources for use in optical devices including medical instruments. Particularly, such ultra-high pressure discharge lamps for use as light sources in liquid crystal projectors are required to be smaller point sources and to exhibit a higher luminance than presently existing light sources in order to ensure clearer and brighter images for a prolonged time. Lamp makers are in fierce competition for satisfying these demands. As a result, at present, the internal volume of an arc tube of an envelope is decreasing gradually and the required internal pressure within such an arc tube upon lighting is approximating to the limit of the strength of the material forming the envelope.

A recent ultra-high pressure discharge lamp calling for such a high pressure is susceptible to lamp explosion upon lighting due to a trivial defect caused during its manufacture. In view of this problem, Japanese Patent Laid-Open Gazette No. HEI 11-118753 has provided an ultra-high pressure discharge lamp wherein a metal foil of each mount to be embedded in a seal portion of an envelope and welded portions of electrode and external lead pin welded to the metal foil are presealed with a preseal glass member; the presealed portion is embedded in the seal portion; and the preseal glass member is wholly fused to the inner peripheral surface of the seal portion to make the preseal glass member and the seal portion integral with each other. In some cases such a lamp can attain a pressure resistance of 140 atm or higher.

However, problems in respect of the lamp reliability and the fraction defective still exist for the following reason. That is, since the preseal glass member embedding the metal foil portion of each mount (formed by welding the metal foil to an electrode at one end thereof and to a lead pin at the opposite end thereof) and the glass material of the seal portion of the envelope are both made of quartz, fusing can be achieved more easily than in the case where the metal foil is directly embedded in the seal portion.

In this case the amount of thermal expansion of metal portions such as the electrode and the external lead pin increases with increasing heating time. Particularly, the process employed to seal the whole seal portion as in the prior art is likely to cause a number of fine cracks to occur at the welded portion between the electrode and the metal foil (see cracks (C) in the enlarged view at FIG. 1). Such fine cracks may initiate lamp explosion and hence may-cause the pressure resistance of the lamp to be lowered substantially. If the lamp explodes, not only broken pieces of glass but also the halogen gas and mercury encapsulated within the lamp are scattered around, thus resulting in a problem of contamination of the surrounding environment.

Accordingly, it is an object of the present invention to provide an ultra-high pressure discharge lamp having seal portions of a structure capable of realizing a pressure resistance of 180 atm or higher while ensuring a higher yield.

It is another object of the present invention to provide an ultra-high pressure discharge lamp having seal portions of a structure capable of preventing scattering of encapsulated substances upon lamp explosion.

SUMMARY OF THE INVENTION

According to the present invention, there is provided an ultra-high pressure discharge lamp comprising: a pair of mounts each comprising a metal foil having one end welded to an associated electrode and an opposite end welded to an associated external lead pin, and a preseal glass member embedding the metal foil therein; and a quartz envelope having an arc tube portion provided with a pair of seal portions on opposite sides thereof, the electrodes associated with the respective mounts being disposed opposite to each other in the arc tube portion, the preseal glass member being hermetically sealed in a respective one of the seal portions, wherein the preseal glass member has a portion fused to an inner peripheral surface of the respective seal portion over an entire circumference thereof.

With this construction in which the preseal glass member has a portion fused to an inner peripheral surface of the respective seal portion over an entire circumference thereof, fusing can be completed in a shorter time than in the case where the whole preseal glass member is fused to the inner peripheral surface of the seal portion, so that the resulting thermal strain can be reduced. The reduction in thermal strain leads to a reduction in the development of fine cracks at the fused portion where the preseal glass member and the inner peripheral surface of the seal portion are fused together, particularly at a portion of the preseal glass member in contact with the root portion of an electrode shank.

Particularly, the possibility of lamp explosion initiated from the root portion can be reduced substantially. As a result, the yield of ultra-high pressure discharge lamp can be improved substantially. In addition, the ultra-high pressure discharge lamp thus constructed requires a substantially shortened heating time as compared with prior-art ultra-high pressure discharge lamps. The shortened heating time can contributes to energy saving and improvement in the dimensional precision in respect of the electrodes.

Preferably, the fused portion of the preseal glass member is an end portion of the preseal glass member situated adjacent the associated electrode.

This feature allows the will-be fused portion of the preseal glass to be fused to the inner peripheral surface of the seal portion in a shorter time and, as a result, it is possible to inhibit the occurrence of fine cracks, which are likely to result from possible overheating as described above, as well as to minimize thermal strain.

Preferably, the preseal glass member has two portions fused to the inner peripheral surface of the seal portion, one being an end portion situated adjacent the associated electrode, the other being an end portion situated adjacent the associated external lead pin.

With this feature, even if fine cracks occur at the preseal glass member, particularly at the portion of the preseal glass member in contact with the root portion of the electrode shank, and grow to reach the clearance between the preseal glass member and the respective seal portion thereby permitting the gas and other substances encapsulated within the arc tube to leak, the fused portion at the end portion of the preseal glass member situated adjacent the associated external lead pin blocks the leaking substances thereby preventing the encapsulated substances such halogen gas and mercury from leaking out of the lamp. Thus, contamination of the surroundings which is possible upon lamp explosion can be avoided.

Preferably, the fused portion of the preseal glass member at the end portion situated adjacent the associated electrode has a length equal to or larger than a wall thickness of a respective one of the seal portions, provided that the length is not larger than 10 mm.

By setting the length of the fused portion to a value equal to or larger than the wall thickness of the respective seal portion the pressure resistance of the fused portion can be made substantially equal to or higher than that of the seal portion. However, if the wall thickness of the seal portion becomes larger than 10 mm, the seal portion is likely to be overheated, which may cause fine cracks to occur as described above.

Preferably, the preseal glass member comprises a preseal tube having a wall thickness smaller than a wall thickness of a respective one of the seal portions.

This feature makes it possible to shorten the heating time thereby inhibiting the occurrence of fine cracks and reducing the thermal strain as in the above-described cases.

The foregoing and other objects, features and attendant advantages of the present invention will become apparent from the reading of the following detailed description in connection with the accompanying drawings.

DETAILED DESCRIPTION OF THE PREFERRED EMBODIMENTS

The present invention will now be described in detail by way of preferred embodiments (A) with reference to the accompanying drawings.

Figure 1:
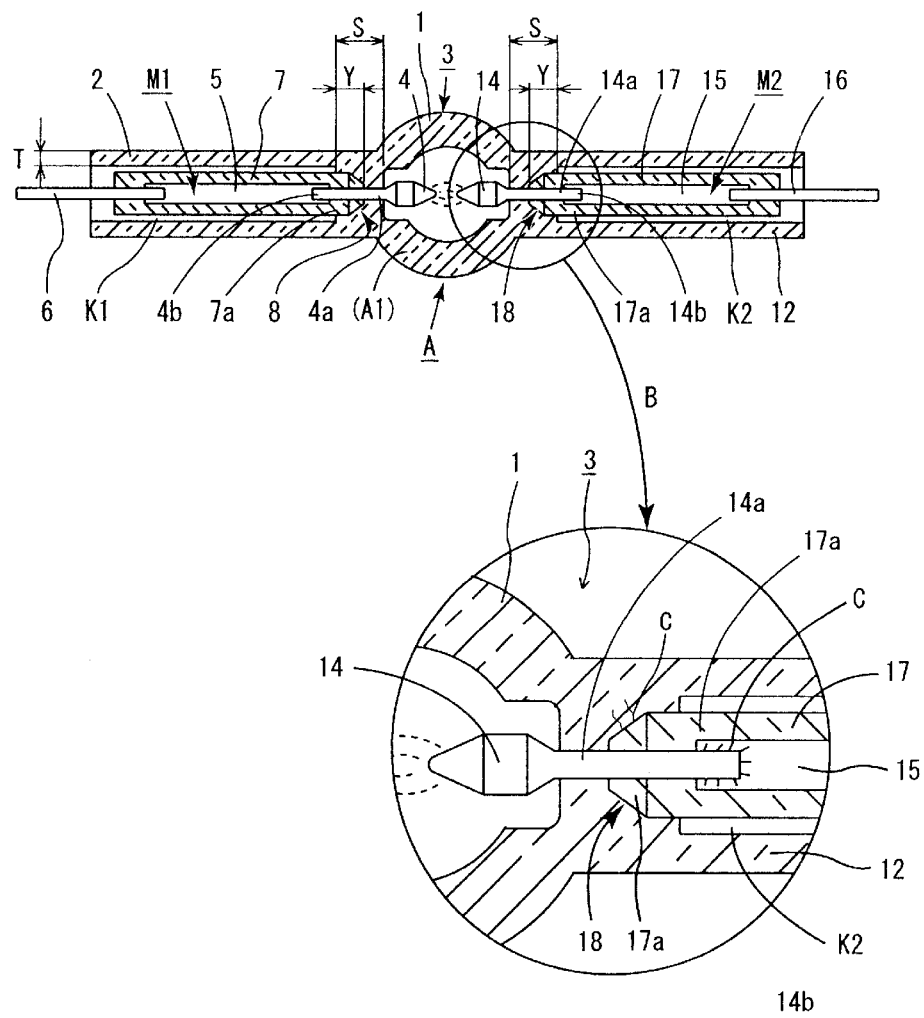
FIG. 1 is a sectional view showing an ultra-high pressure discharge lamp as a first embodiment of the present invention.

Referring first to FIG. 1, there is shown an ultra-high pressure discharge lamp (A1) of the double-ended type. While the present invention is, of course, applicable to ultra-high pressure discharge lamps of the single-ended type, description is herein made of the double-ended type ultra-high pressure lamp (A1) as a representative of ultra-high pressure lamps to which the invention is applicable. In FIG. 1, the encircled portion (B) is shown in enlarged view to indicate the location of cracks (C) which occur not in the present invention but in the prior art.

An envelope 3 is made of vitreous silica, which can hardly expand and shrink thermally. The envelope in a state before processing comprises a spherical arc tube 1 and cylindrical seal portions 2 and 12 extending from opposite ends of the arc tube 1. Vitreous silica, which has a softening point of about 1,650° C., is usually processed at a processing temperature of 2,000° C. or higher. Empirically, such an envelope deforms at 1,200° C. or higher. While the pressure resistance of the envelope varies depending on the wall thickness of the envelope, variation in the wall thickness and wall surface roughness, the arc tube portion 1 usually has a wall thickness of about 1 to about 2 mm and an internal volume of about 0.18 to about 0.5 cc.

A mount (M1) is formed by welding a molybdenum foil 5 to an electrode 4 at one end thereof and to an external lead pin 6 at the other end thereof and embedding the molybdenum foil 5 including the welded portions into a preseal glass member 7. The preseal glass member 7 has an end portion shaped into a truncated cone on the side adjacent the electrode. A counterpart mount (M2) is formed in the same manner. In the case where the subject discharge lamp (A1) is adapted for alternating current, the mounts (M1) and (M2) are identical in shape with each other. However, in the case where the subject discharge lamp (A1) is adapted for direct current, the electrode serving as the anode may be larger than the opposite electrode serving as the cathode. For convenience, description herein is made without distinguishing one mount from the other.

Referring briefly to the procedure of manufacturing the mount (M1) (the same procedure for the mount (M2)), an end portion of electrode shank 4a of the electrode 4 is spot-welded to one end of the molybdenum foil 5; subsequently one end of the external lead pin 6 is spot-welded to the other end of the molybdenum foil 5; and the assembly thus formed is inserted into a quartz preseal tube 18 having a wall thickness of 0.8 to 0.5 mm.

Figure 3:
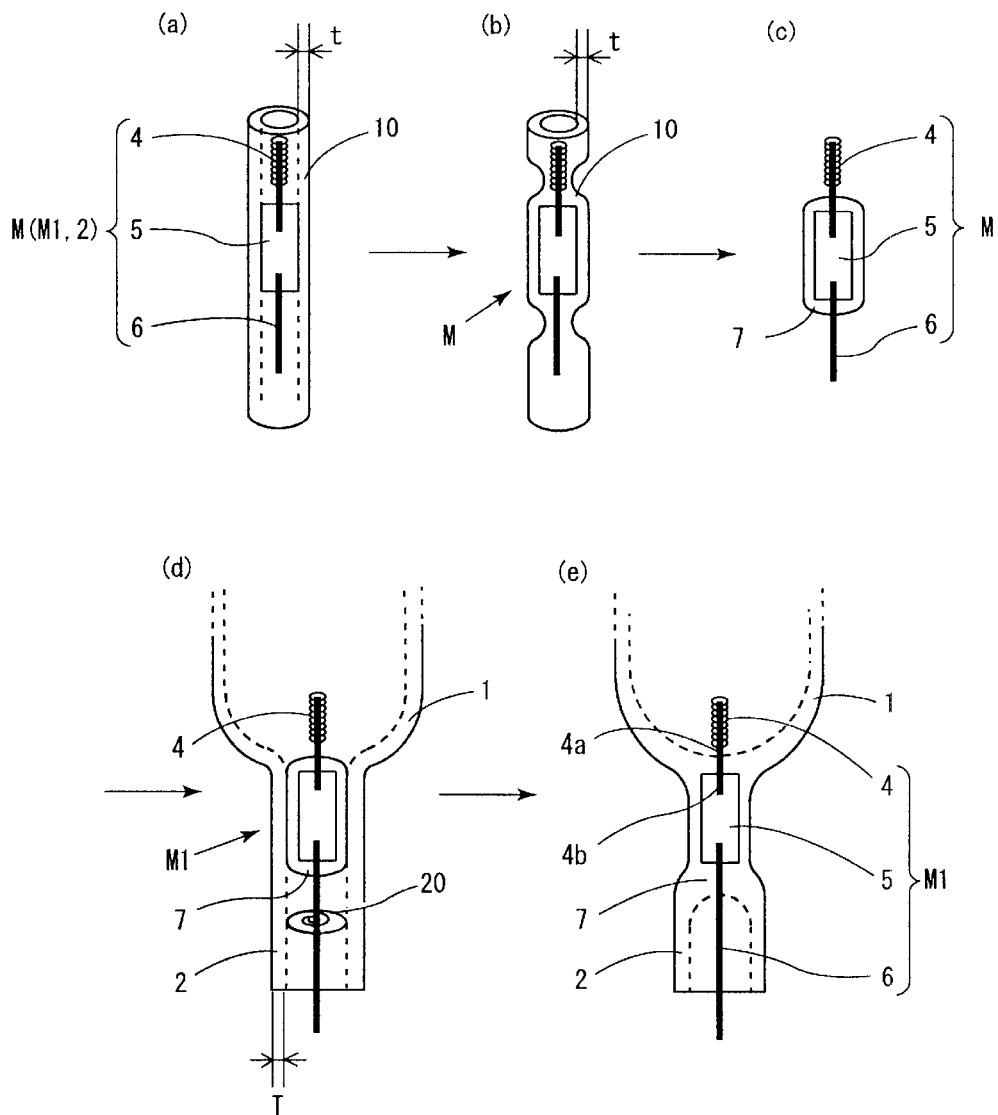
FIG. 3 is a perspective view illustrating the procedure of manufacturing a mount used in the present invention.

Thereafter, the preseal tube 8 is thermally shrunk by heating at an elevated temperature, for example 2,000° C. or higher, to form the preseal glass member 7 of a substantially columnar shape in which the molybdenum foil 5 is wholly embedded; and then the preseal glass member 7 thus formed is severed at a predetermined portion to form the mount (M1) (see FIG. 3). In this case the preseal tube 8 having a thinner wall is more advantageous since the required heating time becomes shorter. This holds true for the mount (M2).

The mount (M1) thus formed is inserted into the seal portion 2 of the envelope 3 until it reaches a predetermined position and then provisionally fixed at the predetermined position in the seal portion 2 by utilizing the resilient force of a ring attached to the external lead pin 6 extending from the mount (M1). With this state being kept, the seal portion 2 is heated from outside in an inert atmosphere. Specifically, intense heating is made on a base portion (S) of the seal portion 2 at an elevated temperature, for example 2,000° C. or higher, for 10 to 12 seconds for example to cause this portion to shrink so that the end portion 7a of the preseal glass member 7 situated adjacent the electrode 4 is hermetically fused to the inner peripheral surface of the base portion (S) of the seal portion 2 over the entire circumference thereof. In this case the fusing is conducted in such a manner that the end portion 7a on the electrode side is not exposed in the arc tube 1 and that a part of the base portion (S) of the seal portion 2 embraces the electrode shank 4a of the electrode 4 directly and embeds the end portion 7a in the seal portion 2. It should be noted that reference character (S) indicates a fused range in the base portion of the seal portion 2, while reference character (Y) indicates a fused range extending between the fused base portion (S) and the end portion 7a on the electrode side.

After one mount (M1) has been thus fused to one seal portion 2, required gas, mercury and other required substances to be encapsulated are encapsulated in the arc tube 1. Subsequently, the other mount (M2) is inserted into the other seal portion 12 and then the spacing between the tip of the electrode 4 of the mount (M1) first fused and fixed and the tip of the electrode 14 of the mount (M2) inserted next (electrode gap) is adjusted to a predetermined value (0.8 to 1.5 mm) precisely. Thereafter, with the arc tube 3 being cooled with a coolant, intense heating is made on a base portion (S) of the other seal portion 12 so that an end portion 17a of the preseal glass member 17 situated adjacent the electrode 14 is hermetically fused to the inner peripheral surface of the base portion (S) of the seal portion 12 over the entire circumference thereof in the same manner as described above. Note that the mount (M2) also is provisionally fixed by utilizing the resilient force of a ring (not shown) attached to an external lead pin 16 extending from the mount (M2). In this way the heads of the respective electrodes are disposed opposite to each other with the predetermined spacing secured precisely therebetween. The ultra-high pressure discharge lamp (A1) shown in FIG. 1 is thus manufactured. As described with reference to the mount (M1), reference character (S) indicates a fused range in the base portion of the seal portion 12, while reference character (Y) indicates a fused range extending between the fused base portion (S) and the end portion 17a on the electrode side.

The fused range (Y) is set equal to or larger than the wall thickness (T) of the seal portion 2,12. Since, usually, the length of the preseal glass member 7,17 is 20 to 30 mm and the wall thickness (T) of the seal portion 2,12 is about 1.4 to 2.0 mm, the fused range is 1.4 to 10 mm or is selected from an extent of 10 mm from the end of the electrode shank 4a, 14a adjoining the electrode head. If the fused range (Y) is less than 1.4 mm, the fused portion becomes a weak point having the lowest pressure resistance and hence is likely to cause lamp explosion to be initiated therefrom upon lighting. On the other hand, if the fused range (Y) is 10 mm or more, the fusing time becomes prolonged, which causes fine cracks (C) to occur easily at the fused portion, particularly at a portion adjacent the root portion 4b,14b of the electrode shank 4a,14a, resulting in a lamp having a decreased pressure resistance.

As described earlier with reference to the prior art, fusing the entire seal portion 2, 12 takes a prolonged time, which brings adverse effects such as to reduce the energy-saving effect and lower the precision in respect of the position and dimensions of the electrodes. In contrast, the partial fusion method employed by the present invention is capable of inhibiting the occurrence of fine cracks (C) at the fused portion between the preseal glass member 7,17 and the seal portion 2,12, particularly in the range (Y) and hence allows ultra-high pressure discharge lamps (A) having high pressure resistance to be produced with a high yield. Since the preseal glass 7,17 is heated through the seal portion 2,12 in fusing the seal portion 2,12 and the preseal glass member 7,17 to each other, the heat capacity of the preseal glass member 7,17 decreases as its wall thickness decreases, that is, the temperature of the preseal glass can be raised more rapidly with decreasing wall thickness. Accordingly, decreasing the wall thickness of the preseal glass is highly effective in shortening the required fusing time.

Figure 2:
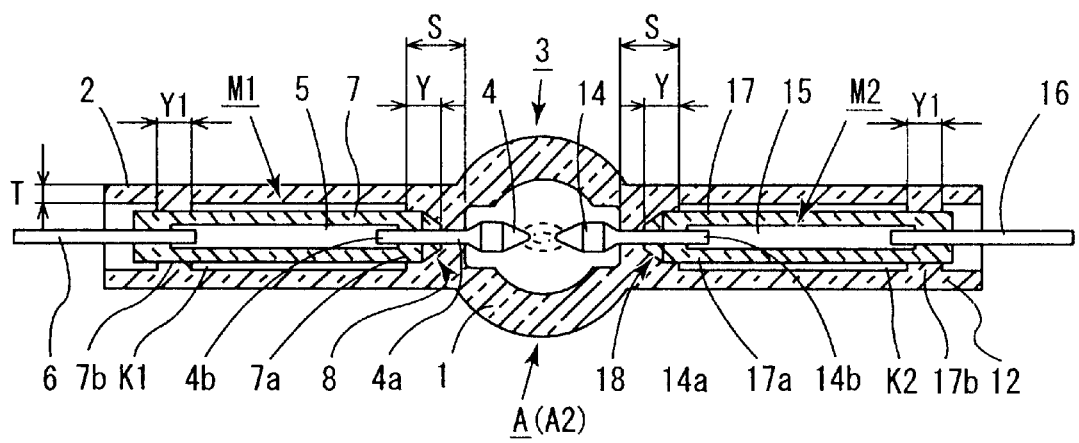
FIG. 2 is a sectional view showing an ultra-high pressure discharge lamp as a second embodiment of the present invention.

FIG. 2 shows the second embodiment of the present invention wherein the end portion 7b,17b of preseal glass member 7,17 situated adjacent external lead pin 6,16 is also fused to the inner peripheral surface of seal portion 2,12 over the entire circumference thereof. In this case, even if fine cracks occur at the preseal glass member 7,17 and grow to reach clearance (K1) or (K2) between the seal portion 2,12 and the preseal glass member 7,17 thereby permitting the encapsulated substances (harmful halogen gas and mercury for example) to flow into the clearance (K1) or (K2), fused portion (Y1) at the end portion 7b,17b situated adjacent the external lead pin 6,16 blocks the leaking substances thereby preventing the encapsulated substances from leaking out of the lamp. It should be noted that the fused range (Y) is the same as in the first embodiment.

Table 1 provides comparison as to pressure resistance between lamps according to the present invention (with partially fused seal portions) and those according to the prior art (with entirely fused seal portions).

TABLE 1

| Sample No. | Prior Art | | Invention | |
|---|---|---|---|---|
| | Cracks | Pressure Resistance | Cracks | Pressure Resistance |
| 1 | Satisfactory | 270 | Satisfactory | 250 |
| 2 | Satisfactory | 275 | Satisfactory | 305 |
| 3 | Unsatisfactory | 130 | Satisfactory | 285 |
| 4 | Satisfactory | 280 | Satisfactory | 265 |
| 5 | Satisfactory | 250 | Satisfactory | 280 |
| 6 | Satisfactory | 220 | Satisfactory | 265 |
| 7 | Satisfactory | 195 | Satisfactory | 265 |
| 8 | Unsatisfactory | 140 | Satisfactory | 275 |
| 9 | Satisfactory | 190 | Satisfactory | 220 |
| 10 | Unsatisfactory | 135 | Satisfactory | 290 |
| Maximum | | 280 | | 305 |
| Minimum | | 135 | | 220 |

As seen from Table 1, the present invention provides improvements in pressure resistance and yield as compared with the prior art.

As has been described above, the ultra-high pressure discharge lamp according to the present invention is characterized in that the preseal glass member has a portion fused to an inner peripheral surface of the respective seal portion over the entire circumference thereof. This characteristic feature makes it possible to reduce the frequency of occurrence of fine cracks by the thermal strain reduction effect, thereby improving the yield of products substantially. In addition, the present invention requires a substantially shortened heating time as compared with the prior art. The shortened heating time can contributes to energy saving and improvement in the dimensional precision in respect of the electrodes.

In the case where the end portion of the preseal glass situated adjacent the associated electrode, at which the occurrence of cracks would otherwise be likely, is fused to the inner peripheral surface of the respective seal portion in a shorter time, it is possible to minimize the thermal strain thereby to inhibit the occurrence of fine cracks at that portion.

With the feature that fused portions are respectively formed at the end portion of the preseal glass member situated adjacent the associated electrode and at the end portion of the preseal glass member situated adjacent the associated external lead pin, the discharge lamp of the present invention has the advantage that even if the preseal glass member is cracked, the cracking is stopped at the clearance between the preseal glass member and the seal portion and hence does not lead to the breakage of the seal portion, particularly the advantage that the fused portion at the end portion of the preseal glass member situated adjacent the associated external lead pin prevents the encapsulated substances (such as harmful halogen gas and mercury) leaking into the clearance from leaking out of the lamp. Thus, contamination of the surroundings can be avoided even if lamp explosion occurs.

With the feature that the fused portion of the preseal glass member at the end portion situated adjacent the associated electrode has a length equal to or larger than a wall thickness of a respective one of the seal portions, it is possible to impart the fused portion with a sufficient pressure resistance.

With the feature that the preseal glass member comprises a preseal tube having a wall thickness smaller than a wall thickness of a respective one of the seal portions, the required heating time can be shortened and, hence, the thermal strain at the heated and fused portion can be reduced further.

While only certain presently preferred embodiments of the present invention have been described in detail, as will be apparent for those skilled in the art, certain changes and modifications may be made in embodiments without departing from the spirit and scope of the present invention as defined by the following claims.

What is claimed is:

1. An ultra-high pressure discharge lamp comprising:

a pair of mounts each comprising a metal foil having one end welded to an associated electrode and an opposite end welded to an associated external lead pin, and a preseal glass member embedding the metal foil therein; and a quartz envelope having an arc tube portion provided with a pair of seal portions on opposite sides thereof, the electrodes associated with the respective mounts being disposed opposite to each other in the arc tube portion, the preseal glass member being hermetically sealed in a respective one of the seal portions, wherein the preseal glass member has a portion fused to an inner peripheral surface of the respective seal portion over an entire circumference thereof.

2. The ultra-high pressure discharge lamp according to claim 1, wherein the fused portion of the preseal glass member is an end portion of the preseal glass member situated adjacent the associated electrode.

3. The ultra-high pressure discharge lamp according to claim 1, wherein the preseal glass member has two portions fused to the inner peripheral surface of the seal portion, one being an end portion situated adjacent the associated electrode, the other being an end portion situated adjacent the associated external lead pin.

4. The ultra-high pressure discharge lamp according to any one of claims 1 to 3, wherein the fused portion of the preseal glass member at the end portion situated adjacent the associated electrode has a length equal to or larger than a wall thickness of a respective one of the seal portions, provided that the length is not larger than 10 mm.

5. The ultra-high pressure discharge lamp according to any one of claims 1 to 3 wherein the preseal glass member comprises a preseal tube having a wall thickness smaller than a wall thickness of a respective one of the seal portions.

* * * * *

UNITED STATES PATENT AND TRADEMARK OFFICE
CERTIFICATE OF CORRECTION

| | |
|---|---|
| PATENT NO. | : 6,713,963 B2 |
| APPLICATION NO. | : 10/353860 |
| DATED | : March 30, 2004 |
| INVENTOR(S) | : Atsuji Nakagawa |

It is certified that error appears in the above-identified patent and that said Letters Patent is hereby corrected as shown below:

On the title page insert the following:

Item --(30)   Foreign Application Priority Data

February 1, 2002   (JP) .................................. 2002-026070 --.

Signed and Sealed this

Seventeenth Day of July, 2007

JON W. DUDAS
*Director of the United States Patent and Trademark Office*